(12) United States Patent
Moon et al.

(10) Patent No.: US 10,866,507 B2
(45) Date of Patent: Dec. 15, 2020

(54) PELLICLE AND RETICLE INCLUDING THE SAME

(71) Applicant: Samsung Electronics Co., Ltd., Suwon-si (KR)

(72) Inventors: Yongseung Moon, Yongin-si (KR); Heebom Kim, Hwaseong-si (KR); Changyoung Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 214 days.

(21) Appl. No.: 16/125,864

(22) Filed: Sep. 10, 2018

(65) Prior Publication Data

US 2019/0243234 A1    Aug. 8, 2019

(30) Foreign Application Priority Data

Feb. 6, 2018   (KR) .......................... 10-2018-0014337

(51) Int. Cl.
*G03F 1/62*    (2012.01)
*G03F 1/22*    (2012.01)

(52) U.S. Cl.
CPC . *G03F 1/62* (2013.01); *G03F 1/22* (2013.01)

(58) Field of Classification Search
CPC ................. G03F 1/62; G03F 1/22; G03F 1/48
See application file for complete search history.

(56) References Cited

U.S. PATENT DOCUMENTS

| | | |
|---|---|---|
| 6,180,292 B1 | 1/2001 | Acosta et al. |
| 6,368,683 B1 | 4/2002 | Shirasaki |
| 8,518,612 B2 | 8/2013 | Akiyama et al. |
| 9,395,630 B2 | 7/2016 | Yakunin et al. |
| 9,664,999 B2 | 5/2017 | Shih et al. |
| 2005/0025959 A1 | 2/2005 | Bellman |
| 2016/0091787 A1 | 3/2016 | Kirkpatrick et al. |
| 2017/0038676 A1 | 2/2017 | Jung et al. |
| 2017/0200523 A1 | 7/2017 | Umstadter |
| 2017/0205704 A1* | 7/2017 | Nikipelov ........... G03F 7/70891 |

* cited by examiner

*Primary Examiner* — Stewart A Fraser
(74) *Attorney, Agent, or Firm* — Harness, Dickey & Pierce, P.L.C.

(57) ABSTRACT

Provided is a pellicle to be used in a photolithography process. The pellicle a film, at least a portion of which includes carbon allotropes. The film has a first surface and a second surface facing the first surface, the film comprises a doped region including dopants, the doped region adjacent to the first surface, the dopants include least one of boron or nitrogen, and the doped region comprises a bond between an atom of at least one of the dopants and a carbon atom.

20 Claims, 7 Drawing Sheets

US 10,866,507 B2

PELLICLE AND RETICLE INCLUDING THE SAME

CROSS-REFERENCE TO RELATED APPLICATIONS

This U.S. non-provisional patent application claims priority under 35 U.S.C. § 119 to Korean Patent Application No. 10-2018-0014337, filed on Feb. 6, 2018, in the Korean Intellectual Property Office, the entire contents of which are hereby incorporated by reference.

BACKGROUND

Inventive concepts relate to a pellicle used for a photolithography process, and a reticle including the same.

A pellicle is a thin film that is provided on a photomask to help to protect the photomask from an external contamination material (e.g., dust or resist). The pellicle may be prepared to have high transmittance to light used in a photolithography process and to meet various other technical requirements such as heat-dissipation, strength, endurance, and/or stability characteristics. The material for the pellicle is selected in consideration of the wavelength of light used in the photolithography process. However, the wavelength of the light used in the photolithography process is gradually reduced to meet a demand or desire for a semiconductor device with a reduced line width, and such reduction in wavelength induces a change in the material for the pellicle.

SUMMARY

Some example embodiments of inventive concepts provide a pellicle having high optical transmittance and/or high chemical and mechanical endurance.

Some example embodiments of inventive concepts provide a reticle including a highly durable pellicle.

According to some example embodiments of inventive concepts, a pellicle may include a film, at least a portion of which includes carbon allotropes. The film has a first surface and a second surface facing the first surface, the film comprises a doped region including dopants, the doped region adjacent to the first surface, the dopants include least one of boron or nitrogen, and the doped region comprises a bond between an atom of at least one of the dopants and a carbon atom.

According to some example embodiments of inventive concepts, a pellicle may include a film, at least a portion of which includes one of a carbon allotrope. The film has a first surface and a second surface facing the first surface, the film comprises a doped region including dopants, the doped region being adjacent to the first surface, the dopants include boron, and a concentration of the boron in the doped region increases from the first surface to a middle point of the doped region and decreases from the middle point to the second surface.

According to some example embodiments of inventive concepts, a reticle may include a photomask including a mask substrate and a mask pattern on the mask substrate, a pellicle including a first surface and a second surface opposite to the first surface, the first surface being exposed to an outside and the second surface facing the photomask, and a frame between the photomask and the pellicle. The pellicle includes a film, at least a portion of the film including carbon allotropes, the pellicle comprises a doped region including dopants, the doped region being adjacent to the first surface, and the dopants include at least one of boron or nitrogen.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
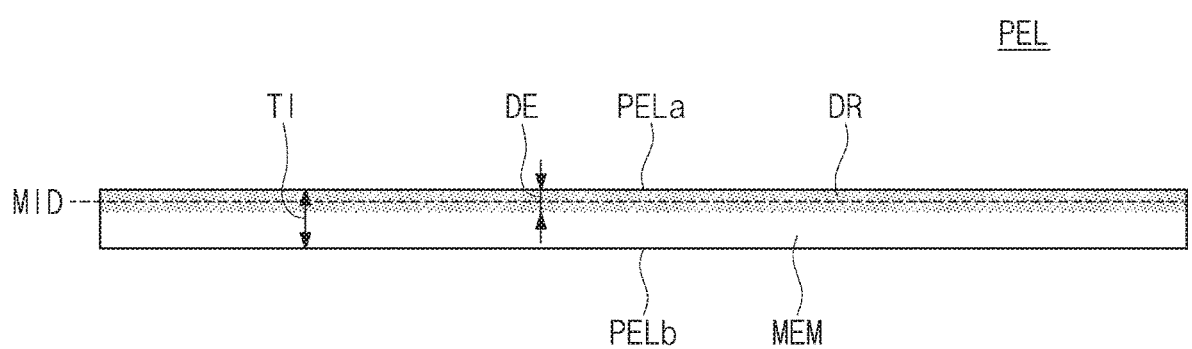
FIG. 1 is a sectional view illustrating a pellicle according to some example embodiments of inventive concepts.
Figure 2A:
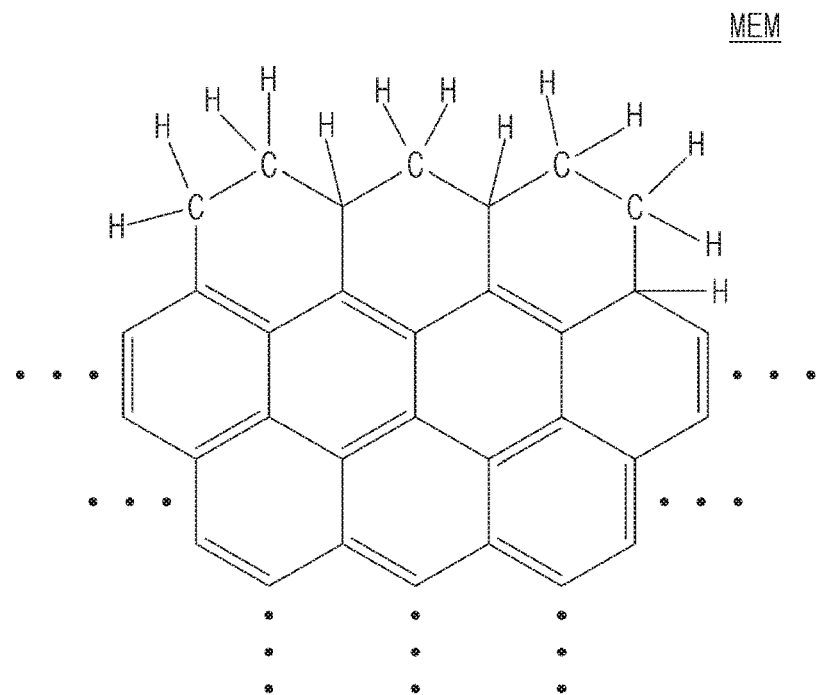
FIG. 2A is a chemical structure diagram of an atomic layer in the pellicle of FIG. 1.
Figure 2B:
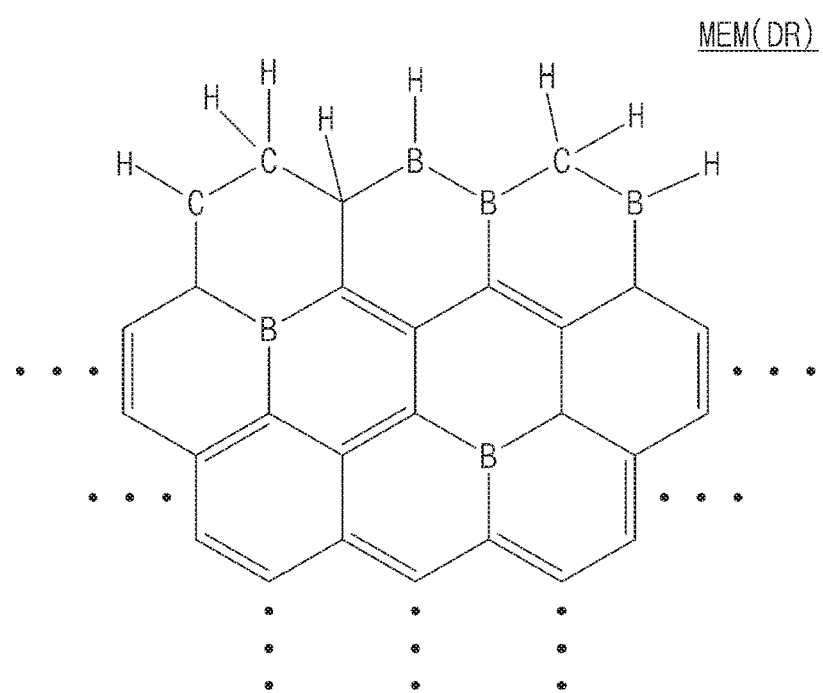
FIG. 2B is a chemical structure diagram of an atomic layer in a doped region of the pellicle of FIG. 1.
Figure 3:
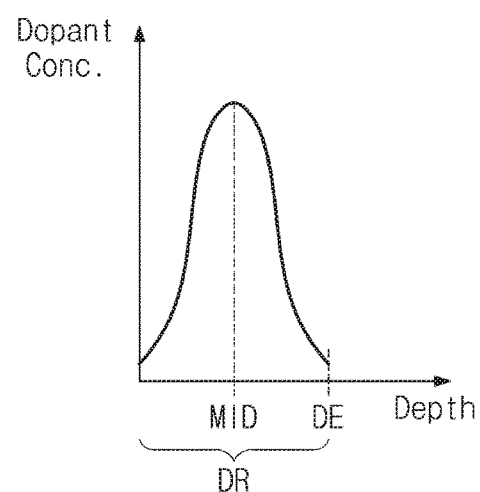
FIG. 3 is a graph showing a dopant concentration profile in the doped region of the pellicle of FIG. 1.

FIG. 1 is a sectional view illustrating a pellicle according to some example embodiments of inventive concepts. FIG. 2A is a chemical structure diagram of an atomic layer in the pellicle of FIG. 1. FIG. 2B is a chemical structure diagram of an atomic layer in a doped region of the pellicle of FIG. 1. FIG. 3 is a graph showing a dopant concentration profile in the doped region of the pellicle of FIG. 1.

Referring to FIGS. 1, 2A, and 2B, a pellicle PEL may be provided in the form of a thin film or membrane MEM. The pellicle PEL or the film MEM may include a first surface PELa and a second surface PELb facing each other. The pellicle PEL may consist of only the film MEM and may have a single-layered structure. In other words, any additional layer (e.g., containing a different material from the film MEM) may not be provided on the first surface PELa and/or the second surface PELb of the film MEM. The first and second surfaces PELa and PELb of the film MEM may be exposed to the air. A thickness TI of the film MEM may range from about 5 nm to about 100 nm.

Referring back to FIG. 2A, the film MEM may be formed of or include carbon allotropes. In some example embodiments, the film MEM may be formed of or include a carbon-containing material (e.g., graphene or graphite) having a two-dimensional atomic structure. The film MEM may include a single carbon atomic layer or a plurality of stacked carbon atomic layers formed of one of the carbon allotropes. For example, the carbon atomic layer may be a single carbon atomic layer, at least a portion of which is formed of carbon atoms that are bonded to each other by covalent bonds. Furthermore, the carbon atoms in the carbon atomic layer may be two-dimensionally arranged.

The film MEM may be a single layer or a few layers, at least a portion of which is formed of one of the carbon allotropes. In the case where the film MEM is provided in the form of a few layers, the film MEM may include between 2 and 100 carbon atomic layers that are vertically stacked. For example, the film MEM may include or consist of the stacked carbon atomic layers, each of which has a two-dimensional structure, and which are vertically coupled to each other by the van der Waals attractive force. As an example, the pellicle PEL may be the film MEM, which consists of a single carbon atomic layer or a few carbon atomic layers.

Each of the two-dimensional carbon atomic layers included in the film MEM of FIG. 2A may be formed of carbon atoms which are coupled to each other to form a two-dimensional honeycomb structure. In the case where the bond between carbon atoms in the atomic layer is broken, hydrogen may be bonded with a carbon atom. Although not shown, at least one of a hydroxyl group, an epoxy group, a carbonyl group, or a carboxyl group, instead of the hydrogen, may be bonded with a carbon atom.

In certain example embodiments, the film MEM may be provided to have a three-dimensional structure, at least a portion of which is formed of one of carbon allotropes. For example, the pellicle PEL or the film MEM may be formed of porous carbon, carbon nanowire, carbon nanotube, or diamond.

The film MEM may include a doped region DR adjacent to the first surface PELa. The doped region DR may be a region of the film MEM that is doped with dopants. For example, the doped region DR may be formed by injecting, e.g. implanting, dopants into the film MEM using an ion implantation process. As an example, a depth DE of the doped region DR in the film MEM may range from about 4 nm to about 10 nm, when measured from the first surface PELa.

The dopants may include an atom having a size similar to that of a carbon atom. The dopant may be selected from elements, which can be substituted for a carbon atom in the film MEM. As an example, at least one of boron (B) or nitrogen (N) may be used as the dopant in the doped region DR. In the case where an element, which is incapable of being substituted for a carbon atom, is used as the dopant, improving endurance of the pellicle PEL and transmittance of the pellicle PEL to extreme ultraviolet (EUV) light may be difficult.

Referring back to FIG. 2B, the two-dimensional carbon atomic layer included in the film MEM may contain a dopant (e.g., boron). For example, a boron atom may be substituted for a carbon atom in the film MEM to form a B—C bond with another carbon atom adjacent thereto. In certain example embodiments, boron atoms may be used to be substituted for an adjacent pair of carbon atoms, and in this case, a B—B bond may be formed. In the doped region DR, a number of the B—C bonds may be more than a number of the B—B bonds. For example, a ratio of the number of B—C bonds to the total number of B—C and B—B bonds may be about 67%, and a ratio of the B—B bonds to the total number of the B—C and B—B bonds may be about 33%. At least one of the boron atoms, which are substituted for the carbon atoms, may be bonded with a hydrogen atom, thereby forming a B—H bond.

The doped region DR may be formed to have a dopant concentration of about 1.0 E20/cm$^3$ to 1.0 E21/cm$^3$. In some example embodiments, an atomic percent of dopants in the doped region DR may range from about 1 at % to about 3 at %. Referring to FIGS. 1 and 3, the dopant concentration of the doped region DR may be highest at a middle point MID of the doped region DR. The dopant concentration of the doped region DR may increase within an interval from the first surface PELa to the middle point MID and may decrease within an interval from the middle point MID to the second surface PELb, as shown in FIG. 3.

A depth from the first surface PELa to the middle point MID may be about half the depth DE of the doped region DR. For example, in the case where the depth DE of the doped region DR is 5 nm, the depth of the middle point MID may be 2.5 nm.

According to some example embodiments of inventive concepts, the pellicle PEL may include or consist of the film MEM, which is formed of one of carbon allotropes and has a thickness ranging from about 5 nm to about 100 nm, and in this case, the pellicle PEL may have transmittance of about 70% or higher to the EUV light. Thus, the pellicle PEL according to some example embodiments of inventive concepts may be used for an EUV exposure system. In addition, the pellicle PEL according to some example embodiments of inventive concepts may have high thermal conductivity, good heat-dissipation characteristics, high mechanical strength (e.g., high tensile strength), and/or good EUV resistant characteristics.

Experimental Example

A 50 nm thick graphite layer was formed on a nickel layer by a CVD deposition process. An ion implantation process was performed on the graphite layer to implant boron into the graphite layer. In the ion implantation process, an ion acceleration energy was 500 eV and a boron dose was adjusted to 6.0 E14/cm$^2$. A pellicle according to the experimental embodiment was prepared by detaching the graphite layer from the nickel layer.

When EUV light emitted from an EUV system was irradiated on the prepared pellicle, the pellicle had transmittance of about 70% to the EUV light. According to an XPS analysis performed on the pellicle, boron doped in the graphite layer had an atomic percent of 1.24 at %. With regard to the bonding structure of doped boron, ratios of B—C bonds and B—B bonds to a total number of B—C bonds and B—B bonds were 67% and 33%, respectively. According to a secondary ion mass spectrometry (SIMS) analysis performed on the pellicle, a boron concentration was 1.0 E21/cm$^3$ in an interval from a surface of the pellicle to a depth of 5 nm.

Comparative Example

A 30 nm thick graphite layer was formed on a nickel layer by a CVD deposition process. A pellicle according to the comparative example was prepared by forming a 10 nm thick B4C layer (i.e., a capping layer) on the graphite layer. That is, in the pellicle according to the comparative example, a surface of the graphite layer was covered with the B4C layer.

When EUV light emitted from an EUV system was irradiated on the pellicle according to the comparative example. As a result of the irradiation of the EUV light, the pellicle according to the comparative example was heated. The breakage of the pellicle according to the comparative example was found, after the irradiation of the EUV light. Further analysis showed that a difference in thermal expansion coefficient between the graphite layer and the B4C layer caused an increase of a thermal stress to be exerted on the pellicle and the consequent breakage of the pellicle.

Figure 4:
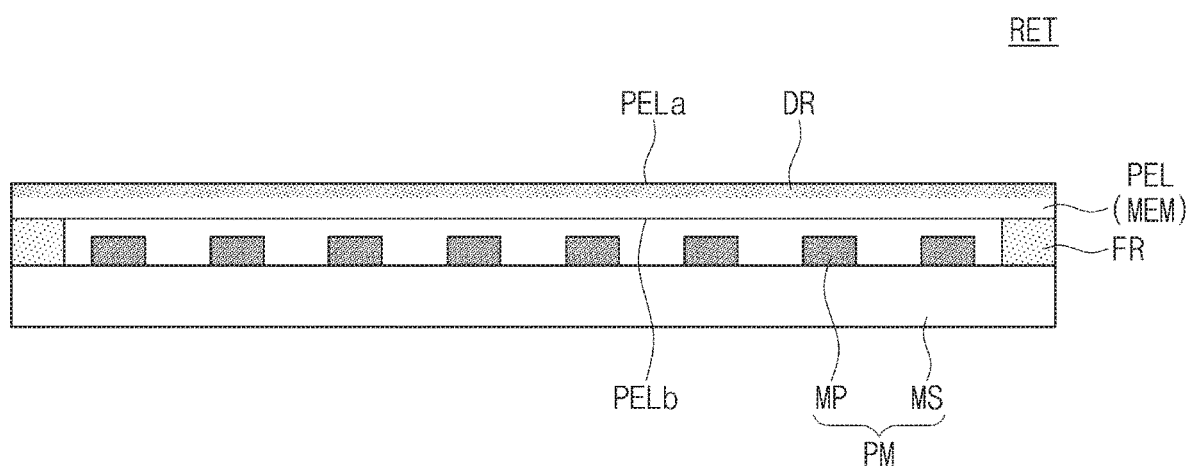
FIG. 4 is a sectional view illustrating a reticle according to some example embodiments of inventive concepts.

FIG. 4 is a sectional view illustrating a reticle according to some example embodiments of inventive concepts. For concise description, an element previously described with reference to FIGS. 1 to 3 may be identified by the same reference number without repeating an overlapping description thereof.

Referring to FIG. 4, a reticle RET may include a photomask PM, the pellicle PEL configured to protect the photomask PM, and a frame FR provided between the photomask PM and the pellicle PEL.

The photomask PM may include a mask substrate MS and mask patterns MP on the mask substrate MS. Shapes, sizes, and intervals of the mask patterns MP are not limited to the example shown in FIG. 1 and may be variously changed. The first surface PELa of the pellicle PEL may be exposed to the outside. The second surface PELb of the pellicle PEL may be provided to face the photomask PM.

The frame FR may be between the pellicle PEL and the photomask PM. The pellicle PEL may be spaced apart from the photomask PM by the frame FR. The frame FR may be provided between an edge portion of the pellicle PEL and an edge portion of the photomask PM. When viewed in a plan view, the frame FR may have a tetragonal, rectangular, or circular shape.

Although not shown, an adhesive layer may be interposed between the pellicle PEL and the frame FR. An adhesive layer may also be interposed between the pellicle PEL and the mask substrate MS.

The pellicle PEL may be configured to protect or help to protect the photomask PM from an external contamination material such as dust, resist, and so forth. In a case where the pellicle PEL is not provided on the photomask PM, an external contamination material may be adhered to the photomask PM, and this may lead to various defects in a photolithography process. This will be described in more detail with reference to FIGS. 7 and 8.

Figure 5:
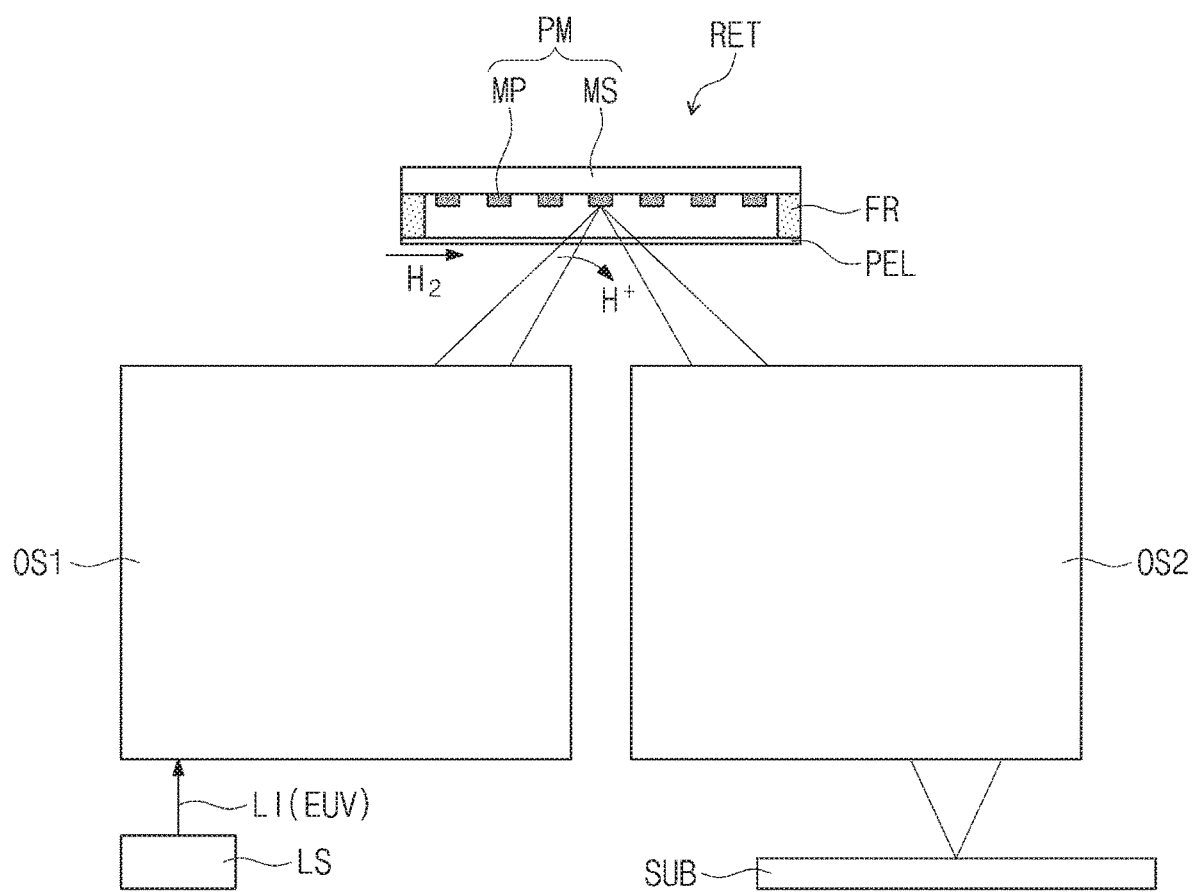
FIGS. 5 and 6 are conceptual diagrams, each of which illustrates an exposure system using a reticle according to some example embodiments of inventive concepts.
Figure 6:
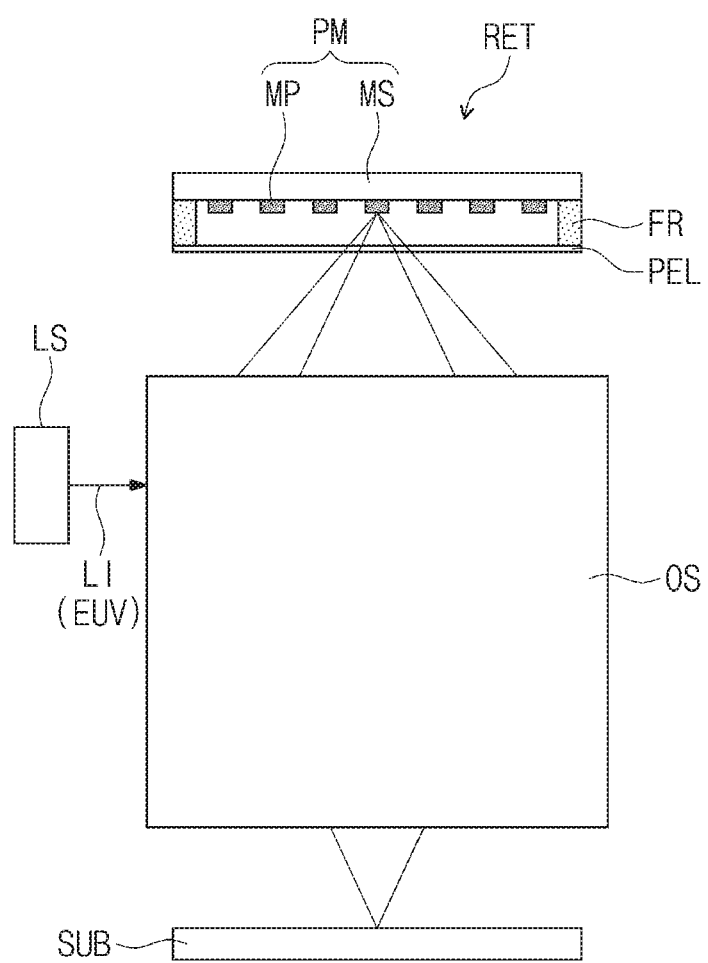

FIGS. 5 and 6 are conceptual diagrams, each of which illustrates an exposure system using a reticle according to some example embodiments of inventive concepts. For concise description, an element previously described with reference to FIGS. 1 to 4 may be identified by the same reference number without repeating an overlapping description thereof.

Referring to FIGS. 4 and 5, an exposure system may include a light source LS, a first optical system OS1, the reticle RET, and a second optical system OS2. The light source LS may be configured to generate light LI, and the first optical system OS1, the reticle RET and the second optical system OS2 may be configured to allow the light L1 to be incident onto a substrate SUB.

The light LI generated by the light source LS may be extreme ultraviolet (EUV) light. For example, the light source LS may be configured to generate EUV light having a wavelength of about 13.3 nm-13.5 nm. In certain example embodiments, the light source LS may be configured to generate EUV light having a wavelength of 13.3 nm or less.

The first optical system OS1 may be an illumination optical system. For example, the first optical system OS1 may include at least one collimating lens and/or at least one alignment optical system. The second optical system OS2 may be a projection optical system. For example, the second optical system OS2 may include at least one reflecting member and/or at least one lens. The structure of each of the first and second optical systems OS1 and OS2 may be variously changed, and inventive concepts is not limited to a specific structure.

In some example embodiments, the reticle RET may be or include a reflection-type reticle. For example, the reticle RET may include the photomask PM, which is configured to reflect light incident thereto, and the pellicle PEL, which is configured to protect the photomask PM. As an example, the mask substrate MS of the photomask PM may be configured to reflect an EUV light, and the mask patterns MP of the photomask PM may be configured to absorb the EUV light.

The light LI generated by the light source LS may be reflected by the reticle RET and then may be incident into the substrate SUB. The substrate SUB may include a region or layer to be patterned. For example, the substrate SUB may be a wafer, on which a resist layer (not shown) is formed. Light reflected by the reticle RET may be focused on the resist layer of the substrate SUB. As a result, the geometry of the mask patterns MP may be transferred onto the substrate SUB.

Referring to FIGS. 4 and 6, the exposure system may include the light source LS, an optical system OS, and the reticle RET. The light LI emitted from the light source LS may be incident into the substrate SUB through the optical system OS and the reticle RET. In detail, the light LI emitted from the light source LS may be incident into the reticle RET through the optical system OS, and then may be reflected by the reticle RET to be incident into the substrate SUB through the optical system OS. The optical system OS may include the first optical system OS1 and the second optical system OS2 previously described with reference to FIG. 5. For example, the optical system OS may include both of the illumination optical system and the projection optical system.

The exposure system, which was previously described with reference to FIGS. 5 and 6, and the pellicle provided therein may be used for a photolithography process to be performed using EUV light. However, inventive concepts are not limited thereto, and the exposure system and the pellicle therein may be used for a photolithography process, in which light having a different wavelength from the EUV light is used.

A photolithography process using a reticle, according to some example embodiments of inventive concepts, will be described in more detail with reference to FIG. 5.

Referring to FIGS. 4 and 5, in an exposure step of the photolithography process, hydrogen gas ($H_2$) may be supplied onto the first surface PELa of the pellicle PEL. Hydrogen ions ($H^+$) may be produced from the hydrogen gas ($H_2$) by the EUV light to be incident to the reticle RET. In other words, hydrogen ions ($H^+$) may be produced on the first surface PELa of the pellicle PEL.

In a comparative example, the pellicle PEL may not have the doped region DR of FIG. 4, and in this case, the first surface PELa of the pellicle PEL may consist of the carbon atomic layer of FIG. 2A. The first surface PELa of the pellicle PEL may include C—H bonds, and in this case, a volatile gas (e.g., CH$_4$) may be formed by reaction the hydrogen ions (H$^+$) and the C—H bonds. Owing to the hydrogen ions (H$^+$), as the exposure step is repeated, the number of carbon atoms included in the pellicle PEL may be reduced. For example, as an exposure step is repeated, the first surface PELa of the pellicle PEL may be etched or recessed. Accordingly, using the pellicle PEL for a long time may be difficult, and more frequently replacing the pellicle PEL may be necessary or required.

In some example embodiments, the pellicle PEL may include the doped region DR adjacent to the first surface PELa, as illustrated in FIGS. 1, 2B, and 4. In a carbon atomic layer in the doped region DR, a site of a carbon atom may be substituted with a dopant atom. The substituted dopant atom may suppress the reaction of the hydrogen ions (H$^+$).

For example, the doped region DR may be formed to include B—H bonds, and the hydrogen ions (H$^+$) may not react with the B—H bonds. Accordingly, the doped region DR may prevent, or reduce the likelihood of, the first surface PELa of the pellicle PEL from being etched or recessed during the exposure step.

In some example embodiments, the pellicle PEL may have high transmittance to EUV light and/or may have high chemical and mechanical endurance. In some example embodiments, the pellicle PEL may be used for a long time, and this may allow the pellicle PEL to have high economic efficiency.

Figure 7:
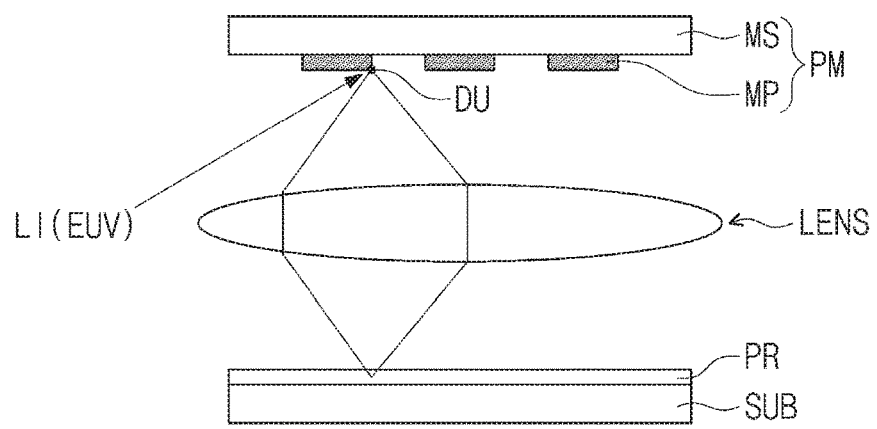
FIG. 7 is a conceptual diagram illustrating a photolithography process using a reticle without a pellicle.

FIG. 7 is a conceptual diagram illustrating a photolithography process using a reticle without a pellicle. Referring to FIG. 7, in the case where the pellicle of FIG. 1 is not provided in a reticle to be used for a photolithography process, an external contamination material DU may be directly adhered to the photomask PM. As an example, the external contamination material DU may be directly adhered to the mask pattern MP.

The light LI reflected by the photomask PM may be incident into a resist layer PR, which is provided on the substrate SUB, through a lens unit LENS. In the case where the external contamination material DU is directly adhered to the mask pattern MP or to the mask substrate MS, the external contamination material DU may lead to various difficulties in a process of patterning the resist layer PR.

Light reflected by the external contamination material DU may be focused on the resist layer PR, and in this case, a shape of the external contamination material DU may be transferred onto the resist layer PR. As a result, there may be a difficulty in patterning the resist layer PR to a desired shape. In the case where a line width of a desired pattern is decreased, the process of patterning the resist layer PR may be greatly affected by the presence of the external contamination material DU.

Figure 8:
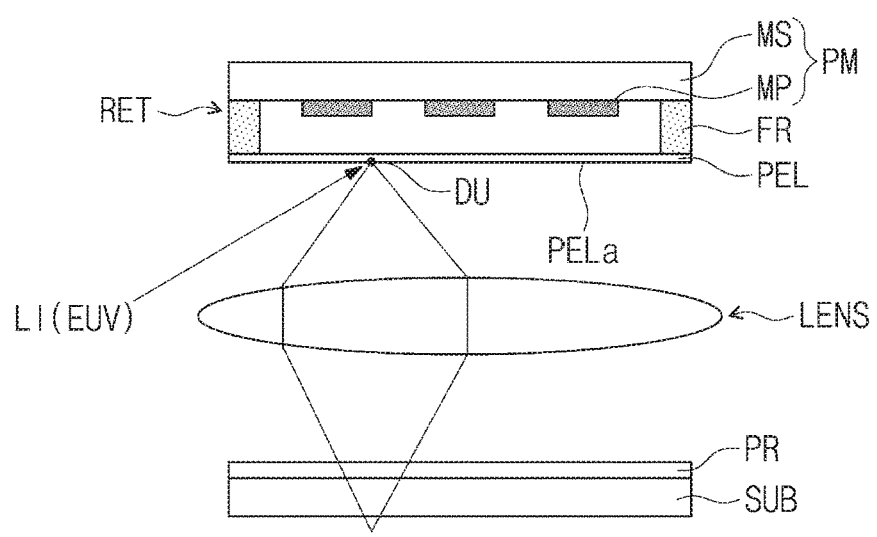
FIG. 8 is a conceptual diagram illustrating a photolithography process using a reticle with a pellicle.

FIG. 8 is a conceptual diagram illustrating a photolithography process using a reticle with a pellicle. Referring to FIG. 8, in the case where the reticle RET with the pellicle PEL is used in a photolithography process (e.g., see FIG. 1), the external contamination material DU may be directly adhered to the first surface PELa of the pellicle PEL. Due to the pellicle PEL, the external contamination material DU may be spaced apart from the mask patterns MP and the mask substrate MS.

In the case where the external contamination material DU is adhered to the pellicle PEL, a process of patterning the resist layer PR may not be significantly affected by the external contamination material DU. Light reflected by the external contamination material DU may not be focused on the resist layer PR and may out of focus on the resist layer PR. In other words, the light reflected by the external contamination material DU may be provided to the resist layer PR in a defocused manner.

As a result, the external contamination material DU adhered to the pellicle PEL may not affect the process of patterning the resist layer PR. As described above, the pellicle PEL according to some example embodiments of inventive concepts may be used to prevent, or reduce the likelihood of, the photolithography process from being affected by the presence of the external contamination material DU.

Figure 9:
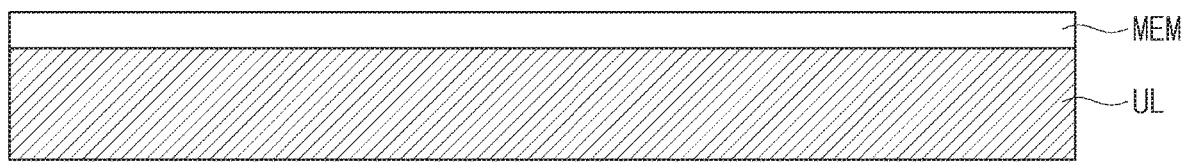
FIGS. 9 and 10 are sectional views illustrating a method of fabricating a reticle according to some example embodiments of inventive concepts.
Figure 10:
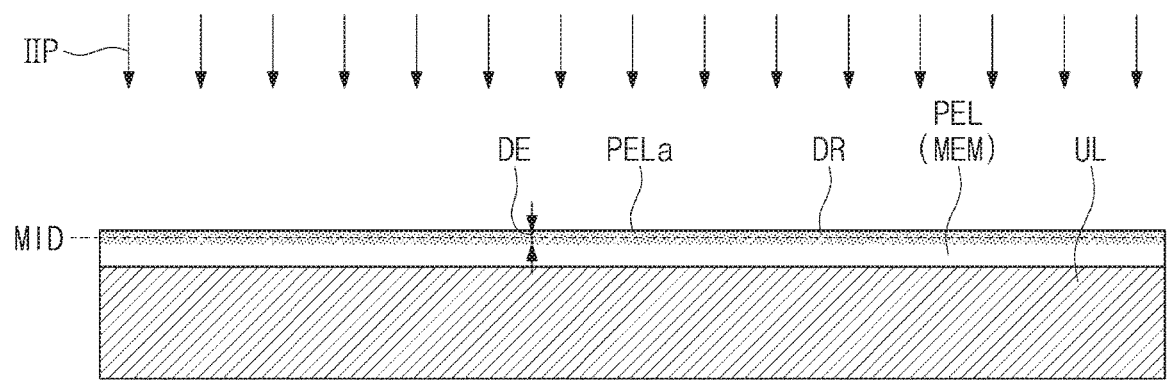

FIGS. 9 and 10 are sectional views illustrating a method of fabricating a reticle according to some example embodiments of inventive concepts.

Referring to FIG. 9, the film MEM may be formed on an underlying layer UL. The underlying layer UL may be formed of or include at least one of metallic materials (e.g., Ni, Cu, and/or Pt), metal oxides, semiconductor materials (e.g., Si and/or Ge), and/or insulating materials (e.g., silicon oxide and/or silicon nitride). The film MEM may be formed to have a thickness of about 5 nm-100 nm.

In some example embodiments, the formation of the film MEM may include forming a layer, which is formed of one of carbon allotropes, on the underlying layer UL using a deposition process (e.g., a chemical vapor deposition (CVD) process). The CVD process may be a thermal CVD process or a plasma CVD process. The plasma CVD may be an inductively-coupled plasma CVD (ICPCVD) process or a plasma-enhanced CVD (PECVD) process. The CVD process may be performed using a gaseous or solid source material (i.e., a carbon-containing source material). The solid source material may include polymer or organic monomer.

In certain example embodiments, the formation of the film MEM on the underlying layer UL may include supplying a solution, including one of carbon allotropes, onto the underlying layer UL. For example, the solution may be a graphene-containing solution which is prepared by mixing graphene particles of several tens of nm or less with solvent. The formation of the film MEM may further include performing a thermal treatment process on a liquid layer, which is formed by depositing the solution on the underlying layer UL.

As an example, the solvent may include at least one of N-methylpyrrolidone (NMP), dimethylformamide (DMF), or ammonium hydroxide (NH$_4$OH). The graphene particles may be or include a graphene quantum dot (GQD) and/or a graphene nanoplate. In certain example embodiments, graphene oxide particles, instead of or along with the graphene particles, may be contained in the solution for the film MEM. The graphene particles and the graphene oxide particles may be prepared by a hydrothermal synthesis method. Various deposition methods (e.g., coating methods or film-casting methods) may be used to deposit the graphene-containing solution on the underlying layer UL. The thermal treatment process may be performed at temperature of about 2000° C. or lower to thermally treat the film MEM provided on the underlying layer UL.

Referring to FIG. 10, a dopant doping process may be performed to dope the film MEM with dopants, thereby forming the pellicle PEL. As a result of the doping of the dopant, the doped region DR may be formed in an upper portion of the film MEM. The doped region DR may be adjacent to the first surface PELa of the film MEM exposed to the outside. The dopant may be used to be substituted for a carbon atom in the film MEM. As an example, at least one of boron (B) or nitrogen (N) may be used as the dopant in the doped region DR.

The dopant doping process may be performed using an ion implantation process IIP. In the ion implantation process IIP, an ion acceleration energy may range from about 100 eV to about 1,000 eV. In other words, the doped region DR may be formed using the ion implantation process IIP, which is performed at a relatively low energy condition. Accordingly, the doped region DR may be formed to have a relatively shallow depth DE (e.g., about 4 nm to about 10 nm). The ion implantation process IIP may be performed under a dose condition of about $1.0\ E11/cm^2$-$1.0\ E20/cm^2$. A dopant concentration of the doped region DR may be highest at the middle point MID of the doped region DR.

Since the ion implantation process TIP according to the present embodiment is performed with a relatively low ion acceleration energy, the dopant may not be physically embedded or interstitial in the film MEM but may be chemically substituted for a carbon atom in the film MEM. For example, as previously illustrated in FIG. 2B, the dopant (e.g., boron) may be substituted for a carbon atom in the doped region DR, and in this case, B—C bonds and B—B bonds may be formed in the doped region DR. Since the boron atom substitutes for a carbon atom, it may be possible to prevent, or reduce the likelihood of, the first surface PELa of the pellicle PEL from being etched by a hydrogen ion ($H^+$), during the exposure process previously described with reference to FIG. 5.

Referring back to FIG. 1, the pellicle PEL may be separated from the underlying layer UL and may be provided on the photomask PM. The pellicle PEL may be disposed on the photomask PM to allow the first surface PELa of the pellicle PEL adjacent to the doped region DR to be exposed to the outside. The frame FR may be provided between the photomask PM and the pellicle PEL. The frame FR may separate the mask patterns MP of the photomask PM from the pellicle PEL.

According to some example embodiments of inventive concepts, a pellicle may be configured to have high transmittance to extreme ultraviolet (EUV) light and to have high chemical and mechanical endurance. Furthermore, since the pellicle is not etched under a hydrogen atmosphere during a photolithography process, it may be possible to economically use the pellicle for a long time.

While example embodiments of inventive concepts have been particularly shown and described, it will be understood by one of ordinary skill in the art that variations in form and detail may be made therein without departing from the spirit and scope of the attached claims.

What is claimed is:

1. A pellicle comprising:
   a film, at least a portion of which includes carbon allotropes,
   wherein the film has a first surface and a second surface facing the first surface,
   the film comprises a doped region including dopants, the doped region adjacent to the first surface,
   the dopants include at least one of boron or nitrogen, and
   the doped region comprises a bond between an atom of at least one of the dopants and a carbon atom.

2. The pellicle of claim 1, wherein the film includes a two-dimensional carbon atomic layer, wherein at least a portion of the two-dimensional carbon layer includes one of the carbon allotropes.

3. The pellicle of claim 1, wherein a concentration of the dopants in the doped region increases from the first surface to a middle point of the doped region and decreases from the middle point to the second surface.

4. The pellicle of claim 1, wherein the dopants include boron.

5. The pellicle of claim 1, wherein an atomic percent of the dopants ranges from about 1 at % to about 3 at %.

6. The pellicle of claim 1, wherein at least some of the dopants are bonded with each other.

7. The pellicle of claim 1, wherein the film has a thickness ranging from 5 nm to 100 nm.

8. The pellicle of claim 1, wherein both the first surface and the second surface are exposed to air.

9. A pellicle comprising:
   a film, at least a portion of which includes a carbon allotrope,
   wherein the film has a first surface and a second surface facing the first surface,
   the film comprises a doped region including dopants, the doped region being adjacent to the first surface,
   the dopants include boron, and
   a concentration of the boron in the doped region increases from the first surface to a middle point of the doped region and decreases from the middle point to the second surface.

10. The pellicle of claim 9, wherein the carbon allotrope includes at least one of graphene, graphite, porous carbon, carbon nanowire, carbon nanotube, or diamond.

11. The pellicle of claim 9, wherein the doped region comprises:
    at least one B—C bond between a boron atom and a carbon atom; and
    at least one of B—B bond between boron atoms, wherein
    a ratio of the at least one B—C bond to a sum of the at least one B—B bond and the at least one B—C bond in the doped region is greater than a ratio of the at least one B—B bond to a sum of the at least one B—B bond and the at least one B—C bond.

12. The pellicle of claim 9, wherein an atomic percent of the boron in the doped region ranges from about 1 at % to about 3 at %.

13. The pellicle of claim 9, wherein the film has a thickness ranging from 5 nm to 100 nm.

14. The pellicle of claim 9, wherein both the first surface and the second surface are exposed to air.

15. A reticle, comprising:
    a photomask including a mask substrate and a mask pattern on the mask substrate;
    a pellicle including a first surface and a second surface opposite to the first surface, the first surface being exposed to an outside and the second surface facing the photomask; and
    a frame between the photomask and the pellicle, wherein
    the pellicle includes a film, at least a portion of the film including a carbon allotrope,
    the pellicle comprises a doped region including dopants, the doped region being adjacent to the first surface,
    the dopants include at least one of boron or nitrogen, and
    a concentration of the dopants in the doped region increases from the first surface to a middle point of the doped region and decreases from the middle point to the second surface.

16. The reticle of claim 15, wherein the doped region comprises a bond between an atom of at least one of the dopants and a carbon atom.

17. The reticle of claim 15, wherein the doped region comprises a bond between at least two atoms of the dopants.

18. The reticle of claim 15, wherein the carbon allotrope include at least one of graphene, graphite, porous carbon, carbon nanowire, carbon nanotube, or diamond.

19. The reticle of claim 15, wherein the pellicle is configured to be transparent to extreme ultraviolet (EUV) light.

20. The reticle of claim 15, wherein a depth of the doped region is between 4 nm and 10 nm.

\* \* \* \* \*